US009153985B1

(12) United States Patent
Gjøvik et al.

(10) Patent No.: US 9,153,985 B1
(45) Date of Patent: Oct. 6, 2015

(54) PORTABLE CHARGING DEVICE

(71) Applicant: Mophie, Inc., Tustin, CA (US)

(72) Inventors: Erik John Gjøvik, Aliso Viejo, CA (US); Soo Youn Park, Tustin, CA (US); Sai Kong Frank Lee, Irvine, CA (US)

(73) Assignee: mophie, Inc., Tustin, CA (US)

( * ) Notice: Subject to any disclaimer, the term of this patent is extended or adjusted under 35 U.S.C. 154(b) by 0 days.

(21) Appl. No.: 14/536,505

(22) Filed: Nov. 7, 2014

Related U.S. Application Data

(60) Provisional application No. 62/057,591, filed on Sep. 30, 2014.

(51) Int. Cl.
*H02J 7/00* (2006.01)
*H05K 7/20* (2006.01)

(52) U.S. Cl.
CPC ............ *H02J 7/0042* (2013.01); *H02J 7/0045* (2013.01); *H02J 7/0054* (2013.01); *H05K 7/2039* (2013.01)

(58) Field of Classification Search
CPC ..... H02J 7/0042; H02J 7/0027; H02J 7/0045; H02J 7/0054; H02J 2007/0062
USPC .................................. 320/107, 114, 103, 111
See application file for complete search history.

(56) References Cited

U.S. PATENT DOCUMENTS

| | | | |
|---|---|---|---|
| D300,831 S | 4/1989 | Jenkinds et al. | |
| D303,799 S | 10/1989 | Fennell et al. | |
| 5,001,772 A | 3/1991 | Holcomb et al. | |
| 5,368,159 A | 11/1994 | Doria | |
| 5,508,123 A | 4/1996 | Fan | |
| D372,896 S | 8/1996 | Nagele et al. | |
| 5,586,002 A | 12/1996 | Notarianni | |
| 5,604,050 A | 2/1997 | Brunette et al. | |
| 5,610,979 A | 3/1997 | Yu | |
| 5,648,712 A | 7/1997 | Hahn | |
| 5,708,707 A | 1/1998 | Halttunen et al. | |
| 5,711,013 A | 1/1998 | Collett et al. | |
| D392,248 S | 3/1998 | Johansson | |
| D392,939 S | 3/1998 | Finke-Anlauff | |
| 5,786,106 A | 7/1998 | Armani | |
| D400,495 S | 11/1998 | Deslyper et al. | |
| 5,864,766 A | 1/1999 | Chiang | |

(Continued)

OTHER PUBLICATIONS

U.S. Appl. No. 29/422,897 including its prosecution history, filed May 24, 2012, Hasbrook.

(Continued)

*Primary Examiner* — Richard Isla Rodas
*Assistant Examiner* — Nathaniel Pelton
(74) *Attorney, Agent, or Firm* — Knobbe, Martens, Olson & Bear, LLP

(57) ABSTRACT

A charging device for charging an electronic device can include a main body having a recess. First and second electrical cables can be disposed in the recess when in retracted positions, and the first and second electrical cables can extend outside of the main body when in extended positions. The charging device can have a cover that is movable between a closed position, which can cover the recess, and an open position, which can expose the recess to enable the electrical cables to move between the retracted and extended positions. The charging device can include a battery. Electrical power can be received via the second electrical cable for charging the battery. Electrical power can be output from the battery via the first electrical cable to charge an electronic device.

20 Claims, 11 Drawing Sheets

(56) References Cited

U.S. PATENT DOCUMENTS

| | | |
|---|---|---|
| 5,973,477 A | 10/1999 | Chang |
| 6,043,626 A | 3/2000 | Snyder et al. |
| D427,193 S | 6/2000 | Fedele |
| D436,596 S | 1/2001 | Ito et al. |
| 6,171,138 B1 | 1/2001 | Le Febvre et al. |
| 6,184,654 B1 | 2/2001 | Bachner, III et al. |
| 6,208,115 B1 | 3/2001 | Binder |
| 6,317,313 B1 | 11/2001 | Mosgrove et al. |
| 6,324,380 B1 | 11/2001 | Kiuchi et al. |
| D460,411 S | 7/2002 | Wang |
| 6,538,413 B1 | 3/2003 | Beard et al. |
| 6,555,990 B1 | 4/2003 | Yang |
| 6,614,722 B2 | 9/2003 | Polany et al. |
| D487,458 S | 3/2004 | Gentil et al. |
| D496,029 S | 9/2004 | Skulley et al. |
| D503,679 S | 4/2005 | Andre et al. |
| D513,617 S | 1/2006 | Tierney |
| 6,992,461 B2 | 1/2006 | Liang et al. |
| D515,500 S | 2/2006 | Khasminsky |
| D518,477 S | 4/2006 | Cheng |
| D520,502 S | 5/2006 | Xu et al. |
| D525,616 S | 7/2006 | Andre et al. |
| D529,495 S | 10/2006 | Kent et al. |
| 7,166,987 B2 | 1/2007 | Lee et al. |
| D547,056 S | 7/2007 | Griffin et al. |
| D547,057 S | 7/2007 | Griffin et al. |
| D551,216 S | 9/2007 | Wei |
| D556,681 S | 12/2007 | Kim |
| D558,972 S | 1/2008 | Oh |
| D558,973 S | 1/2008 | Hussaini et al. |
| D560,231 S | 1/2008 | Lee |
| D561,092 S | 2/2008 | Kim |
| 7,336,973 B2 | 2/2008 | Goldthwaite et al. |
| D565,571 S | 4/2008 | Trifilio et al. |
| D568,312 S | 5/2008 | Wang et al. |
| D569,629 S | 5/2008 | Yu et al. |
| D570,772 S | 6/2008 | Mahaffey et al. |
| D572,250 S | 7/2008 | Yang |
| D573,946 S | 7/2008 | Ledbetter et al. |
| 7,400,917 B2 | 7/2008 | Wood et al. |
| D575,056 S | 8/2008 | Tan |
| D575,729 S | 8/2008 | Nomi et al. |
| 7,428,427 B2 | 9/2008 | Brunstrom et al. |
| D579,902 S | 11/2008 | Kim et al. |
| D581,151 S | 11/2008 | Aipa |
| D582,149 S | 12/2008 | Tan |
| D584,738 S | 1/2009 | Kim et al. |
| 7,479,759 B2 | 1/2009 | Vilanov et al. |
| D587,896 S | 3/2009 | Aipa |
| D588,147 S | 3/2009 | Finlayson et al. |
| D589,021 S | 3/2009 | Millora |
| D593,940 S | 6/2009 | Nomi et al. |
| D594,833 S | 6/2009 | Park |
| D598,375 S | 8/2009 | Nomi |
| D598,414 S | 8/2009 | Joung et al. |
| D601,583 S | 10/2009 | Andre et al. |
| D601,955 S | 10/2009 | Ekmekdje |
| D601,959 S | 10/2009 | Lee |
| D603,334 S | 11/2009 | Suzuki |
| 7,612,997 B1 | 11/2009 | Diebel et al. |
| D610,538 S | 2/2010 | Wu et al. |
| 7,713,073 B2 * | 5/2010 | Lin .................. 439/131 |
| D618,237 S | 6/2010 | Wang |
| 7,778,410 B2 | 8/2010 | Liu et al. |
| 7,782,610 B2 | 8/2010 | Diebel et al. |
| D623,399 S | 9/2010 | McSweyen |
| D624,747 S | 10/2010 | McSweyen |
| D628,153 S | 11/2010 | Fujii et al. |
| D628,535 S | 12/2010 | Cheng |
| D628,572 S | 12/2010 | Wang |
| D632,648 S | 2/2011 | Yang |
| D633,493 S | 3/2011 | Akana et al. |
| D633,908 S | 3/2011 | Akana et al. |
| D634,704 S | 3/2011 | Tieleman et al. |
| D635,961 S | 4/2011 | Gidden et al. |
| D636,392 S | 4/2011 | Akana et al. |
| D637,951 S | 5/2011 | Perez |
| D637,952 S | 5/2011 | Tan |
| D639,731 S | 6/2011 | Sun |
| D642,516 S | 8/2011 | Ueda et al. |
| D643,427 S | 8/2011 | McGoldrick et al. |
| D645,049 S | 9/2011 | Faranda et al. |
| D645,050 S | 9/2011 | Faranda et al. |
| D647,908 S | 11/2011 | Chen et al. |
| D648,270 S | 11/2011 | Jiang |
| D649,932 S | 12/2011 | Symons |
| D652,379 S | 1/2012 | Vandiver |
| D653,207 S | 1/2012 | Vandiver |
| D654,852 S | 2/2012 | Hansen |
| D654,854 S | 2/2012 | Inskeep |
| D656,096 S | 3/2012 | Sasada et al. |
| D659,094 S | 5/2012 | Brand et al. |
| D661,249 S | 6/2012 | Smith et al. |
| D662,050 S | 6/2012 | Tien |
| D662,904 S | 7/2012 | Wu et al. |
| D663,684 S | 7/2012 | Yang |
| D663,685 S | 7/2012 | Yang |
| D664,501 S | 7/2012 | Inskeep |
| D664,502 S | 7/2012 | Inskeep |
| D665,732 S | 8/2012 | Saito et al. |
| D666,144 S | 8/2012 | Brand et al. |
| D667,788 S | 9/2012 | Mai |
| D671,096 S | 11/2012 | Song et al. |
| D671,937 S | 12/2012 | Akana et al. |
| D672,309 S | 12/2012 | Tien |
| D672,343 S | 12/2012 | Akana et al. |
| D674,748 S | 1/2013 | Ferber et al. |
| D675,156 S | 1/2013 | Vandiver et al. |
| D676,380 S | 2/2013 | Sun |
| D677,223 S | 3/2013 | Cho |
| D677,657 S | 3/2013 | Akana et al. |
| D678,187 S | 3/2013 | Huang |
| D680,063 S | 4/2013 | Sasada |
| D682,196 S | 5/2013 | Leung |
| D682,197 S | 5/2013 | Leung |
| D682,202 S | 5/2013 | Weaver, Jr. et al. |
| D682,777 S | 5/2013 | Gupta et al. |
| D682,781 S | 5/2013 | Wakafuji et al. |
| D683,310 S | 5/2013 | McSweyn |
| D684,571 S | 6/2013 | Akana et al. |
| D685,732 S | 7/2013 | Miller et al. |
| D686,150 S | 7/2013 | Lee et al. |
| D686,152 S | 7/2013 | Lee et al. |
| D686,153 S | 7/2013 | Qu |
| D688,660 S | 8/2013 | Akana et al. |
| D689,847 S | 9/2013 | To |
| 8,541,985 B1 | 9/2013 | Wong |
| D690,693 S | 10/2013 | Akana et al. |
| D692,379 S | 10/2013 | Bae et al. |
| 8,547,061 B1 | 10/2013 | Wong |
| D692,825 S | 11/2013 | Izen et al. |
| D693,297 S | 11/2013 | Inskeep |
| D693,798 S | 11/2013 | Chuang et al. |
| D694,703 S | 12/2013 | Faro |
| D695,214 S | 12/2013 | Roberts et al. |
| D697,865 S | 1/2014 | Saito et al. |
| D699,177 S | 2/2014 | Higashi |
| D704,135 S | 5/2014 | Stewart et al. |
| D714,215 S | 9/2014 | To |
| D720,687 S | 1/2015 | Hasbrook |
| D721,328 S | 1/2015 | Freeman et al. |
| 2001/0054148 A1 | 12/2001 | Hoornaert et al. |
| 2002/0147035 A1 | 10/2002 | Su |
| 2003/0096642 A1 | 5/2003 | Bessa et al. |
| 2003/0218445 A1 | 11/2003 | Behar |
| 2003/0228866 A1 | 12/2003 | Pezeshki |
| 2004/0097256 A1 | 5/2004 | Kujawski |
| 2004/0104268 A1 | 6/2004 | Bailey |
| 2005/0090301 A1 | 4/2005 | Lange et al. |
| 2005/0231159 A1 | 10/2005 | Jones et al. |
| 2005/0247787 A1 | 11/2005 | Von Mueller et al. |
| 2005/0248312 A1 | 11/2005 | Cao et al. |
| 2006/0058073 A1 | 3/2006 | Kim |
| 2006/0063569 A1 | 3/2006 | Jacobs et al. |

(56) References Cited

U.S. PATENT DOCUMENTS

| | | |
|---|---|---|
| 2006/0099999 A1 | 5/2006 | Park |
| 2007/0152633 A1 | 7/2007 | Lee |
| 2007/0167190 A1 | 7/2007 | Moosavi et al. |
| 2007/0236180 A1 | 10/2007 | Rodgers |
| 2007/0297149 A1 | 12/2007 | Richardson et al. |
| 2008/0007214 A1 | 1/2008 | Cheng |
| 2008/0053770 A1 | 3/2008 | Tynyk |
| 2008/0096620 A1 | 4/2008 | Lee et al. |
| 2008/0108395 A1 | 5/2008 | Lee et al. |
| 2008/0123287 A1 | 5/2008 | Rossell et al. |
| 2008/0132289 A1 | 6/2008 | Wood et al. |
| 2009/0051319 A1 | 2/2009 | Fang et al. |
| 2009/0069050 A1 | 3/2009 | Jain et al. |
| 2009/0073650 A1* | 3/2009 | Huang et al. ............. 361/679.56 |
| 2009/0143104 A1 | 6/2009 | Loh et al. |
| 2009/0144456 A1 | 6/2009 | Gelf et al. |
| 2009/0186264 A1 | 7/2009 | Huang |
| 2010/0026589 A1 | 2/2010 | Dou et al. |
| 2010/0064883 A1 | 3/2010 | Gynes |
| 2010/0117597 A1 | 5/2010 | Wang |
| 2010/0190046 A1 | 7/2010 | Chen et al. |
| 2011/0215767 A1* | 9/2011 | Johnson et al. ............... 320/136 |
| 2013/0193911 A1* | 8/2013 | Miller et al. .................. 320/107 |
| 2014/0042969 A1 | 2/2014 | Miller et al. |
| 2014/0051292 A1 | 2/2014 | Weaver et al. |

OTHER PUBLICATIONS

U.S. Appl. No. 29/410,518 including its prosecution history, filed Jan. 9, 2012, To.

U.S. Appl. No. 29/464,271 including its prosecution history, filed Aug. 14, 2013, To.

U.S. Appl. No. 29/478,253 including its prosecution history, filed Jan. 2, 2014., Namminga.

U.S. Appl. No. 29/475,951 including its prosecution history, filed Dec. 9, 2013, Hasbrook et al.

U.S. Appl. No. 29/478,243 including its prosecution history, filed Jan. 2, 2014, Kim.

U.S. Appl. No. 29/501,885 including its prosecution history, filed Sep. 9, 2014, mophie, Inc.

Jeremy Horwitz, "Kensington Mini Battery Pack and Charger for iPhone and iPod," dated May 16, 2008, http://www.ilounge.com/index.php/reviews/entry/kensington-mini-battery-pack-and-charger-for-iphone-and-ipod/.

Kensington Mini Battery Pack and Charger for iPhone and iPod, dated Sep. 30, 2008, 1 page.

Sven Rafferty, "Mybat External Battery for iPhone and iPod," dated May 18, 2008, http://svenontech.com/reviews/?p=74.

Dave Rees, "Richard Solo Backup Battery for iPhone / iPod Review," dated Jun. 16, 2008, http://the-gadgeteer.com/2008/06/16/richard__solo_backup_battery_for_iphone_ipod/.

"Cheap DIY iPhone External Battery," dated Jul. 22, 2008, http://fastdad.wordpress.com/2008/07/22/cheap-diy-iphone-external-battery/.

Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.

Devin Coldewey, "Combination iPhone battery pack and flash from FastMac," dated Nov. 4, 2008, http://crunchgear.com/2008/11/04/combination-iphone-battery-pack-and-flash-from-fastmac/.

* cited by examiner

PORTABLE CHARGING DEVICE

CROSS-REFERENCE TO RELATED APPLICATIONS

The application claims the benefit of U.S. Provisional Patent Application No. 62/057,591, filed Sep. 30, 2014, and titled PORTABLE CHARGING DEVICE, the entirety of which is hereby incorporated by reference and made a part of this specification.

BACKGROUND

1. Field of the Disclosure

Some embodiments of this disclosure generally relate to systems and methods for charging batteries of mobile electronic devices.

2. Description of the Related Art

There current exist a number of charging devices for charging mobile electronic devices. Nevertheless, there remains a need for improved charging devices.

SUMMARY OF CERTAIN EMBODIMENTS

Various embodiments disclosed herein relate to a charging device for charging an electronic device. The charging device can include a main body comprising at least one recess, a battery disposed inside the main body, and a first electrical cable movable between a retracted position and an extended position. The first electrical cable can be disposed in the at least one recess when in the retracted position. The first electrical cable can extend outside the main body when in the extended position. The first electrical cable can include a first electrical connector configured to couple to a corresponding interface on an electronic device, and the charging device can be configured to charge the electronic device through the first electrical cable using electrical power from the battery. The charging device can include a second electrical cable movable between a retracted position and an extended position. The second electrical cable can be disposed in the at least one recess when in the retracted position. The second electrical cable can extend outside the main body when in the extended position. The second electrical cable can include a second electrical connector configured to couple to a power source. The charging device can be configured to charge the battery using electrical power received through the second electrical cable. The charging device can include a cover that is movable relative to the main body. The cover can be movable between a closed position and an open position, and the cover in the closed positioned can cover a least a portion of the recess to impede the first and second electrical cables from moving between the retracted positions and the extended positions. The cover in the open position can be configured to expose the recess such that the first and second electrical cables are movable between the retracted positions and the extended positions.

The main body can include a thermally conductive outer wall, and one or more electrical components inside the main body can be thermally coupled to the thermally conductive outer wall to dissipate heat from the one or in ore electrical components through the thermally conductive outer wall. A first side of a thermal interface material can contact the battery and a second side of the thermal interface material can contact the thermally conductive outer wall. The thermal interface material can include thermal grease, thermal paste, or a thermal pad, etc. A first thermal interface material can directly thermally couple the battery to the thermally conductive outer wall. A second thermal interface material can directly thermally couple one or more electrical components on a printed circuit board to the thermally conductive outer wall. The one or more electrical components can be coupled to the thermally conductive outer wall by a thermal interface material without a heat spreader disposed between the one or more electrical components and the thermally conductive outer wall.

Both the first electrical cable and the second electrical cable can be disposed in the same recess in the main body when in the retracted positions. One of the first and second electrical cables can be disposed on top of the other of the first and second electrical cables when in the retracted positions.

The cover can pivot between the closed position and the open position. A portion of the first electrical cable can be exposed when the cover is in the closed position, and a portion of the second electrical cable can be exposed when the cover is in the closed position.

The charging device can be configured to pass electrical power received through the second electrical cable to the first electrical cable to charge the electronic device without using the battery. The charging device can be configured to transfer data between the electronic device coupled to the first electrical cable and an external electronic device coupled to the second electrical cable.

Various embodiments disclosed herein relate to a charging device, which can include a main body housing with at least one recessed portion, a cover hingedly coupled to the main body housing and configured to move between an open position and a closed position, and a plurality of electrical cables each configured to move between an extended position and a retracted position. The plurality of electrical cables can be configured to fit within the at least one recessed portion of the main body housing when in the retracted positions.

The cover can be configured so that in the closed position the cover overlaps with at least a portion of the at least one recessed portion of the main body housing.

The charging device can include an electrical port on the main body, and the electrical port can be configured to receive an electrical connector and to output electrical power from the battery to the electrical connector.

The charging device can include one or more electrical components and a thermally conductive outer wall configured to dissipate heat from the one or more electrical components.

The charging device can include a battery disposed within the main body housing and a thermally conductive outer wall configured to couple to the battery and to dissipate heat from the battery.

The plurality of electrical cables can pivot between the extended position and the retracted position. The plurality of electrical cables can be disposed in the same recess when in the retracted position.

DETAILED DESCRIPTION OF CERTAIN EMBODIMENTS

Figure 1:
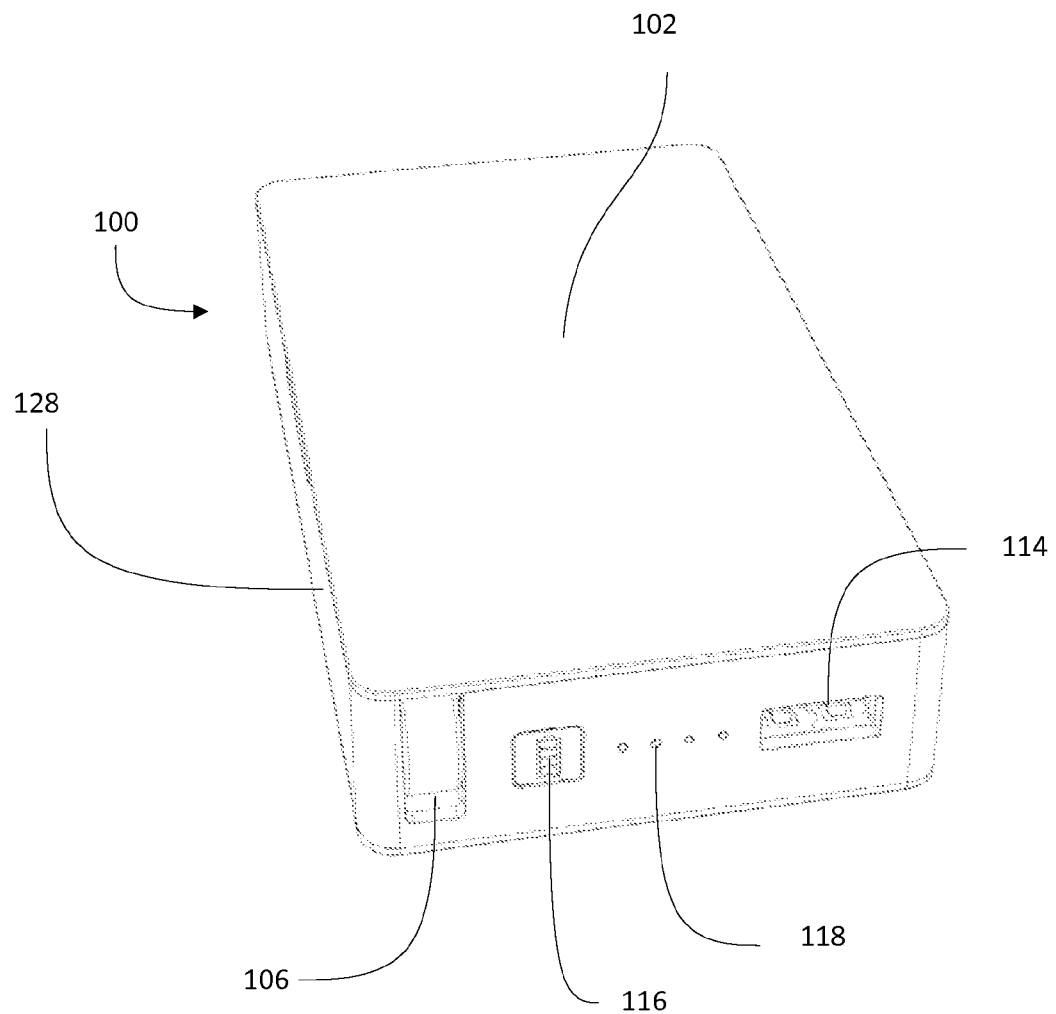
FIG. 1 shows an example of embodiments of a charging device with retracted cables and a closed cover.

In some embodiments a charging device 100 for charging an electronic device 150a or 150b (such as a mobile electronic device) can include a main body housing 128 with at least one recessed portion 120, a battery 124 disposed inside the main body, and one or more electrical cables. The battery 124 can be a rechargeable battery (e.g., a lithium ion battery, a lithium polymer battery, or other suitable battery type). In some embodiments, a charging device 100 can include a cover 102 and a thermally conductive outer wall 104. The one or more electrical cables can each be movable between a retracted position and an extended position. In some embodiments, each of the cables can be disposed in the at least one recessed portion 120 when in the retracted position and extend outside the main body when in the extended position.

Figure 2:
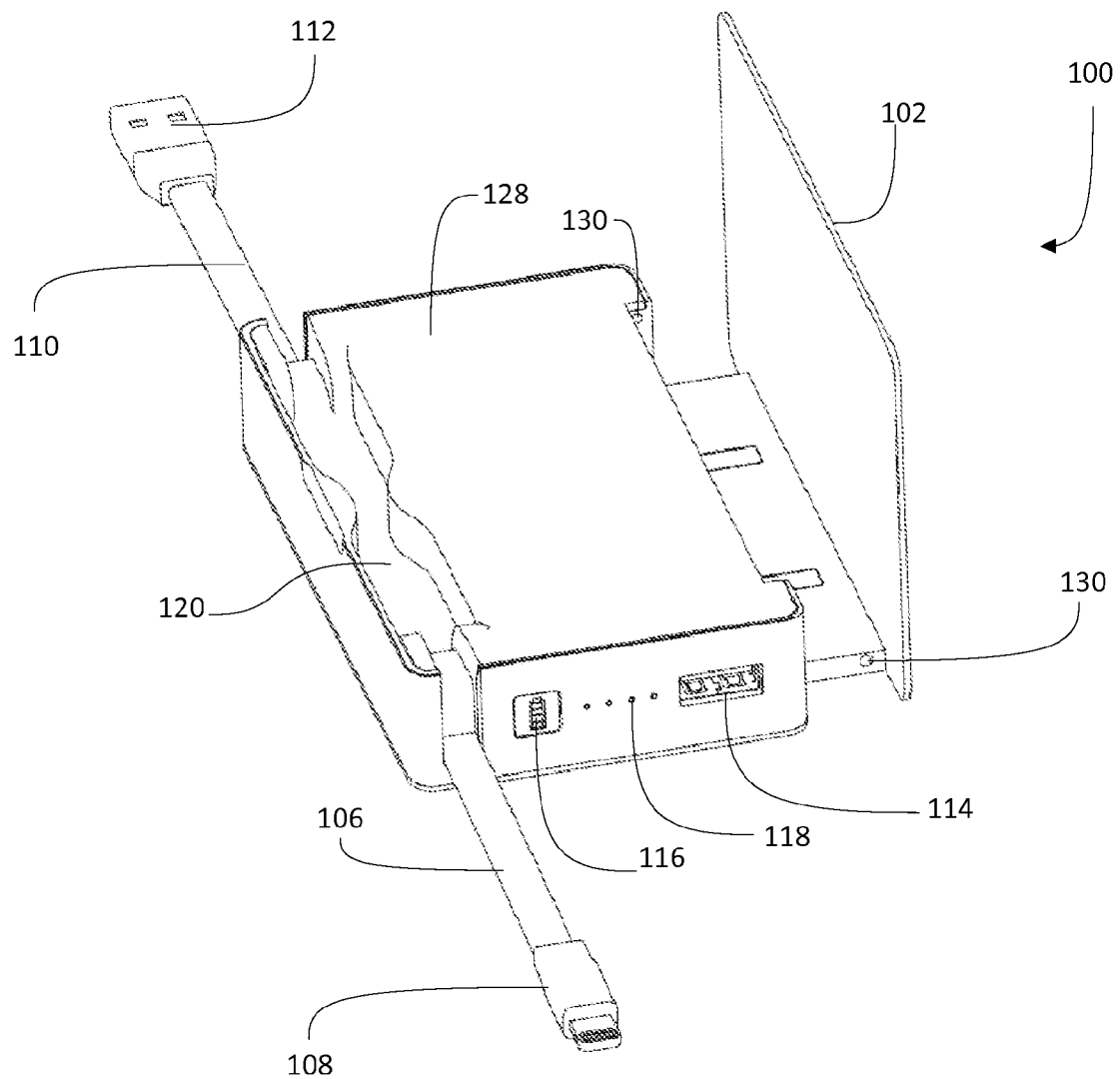
FIG. 2 shows an example of embodiments of a charging device with extended cables and an open cover.
Figure 3:
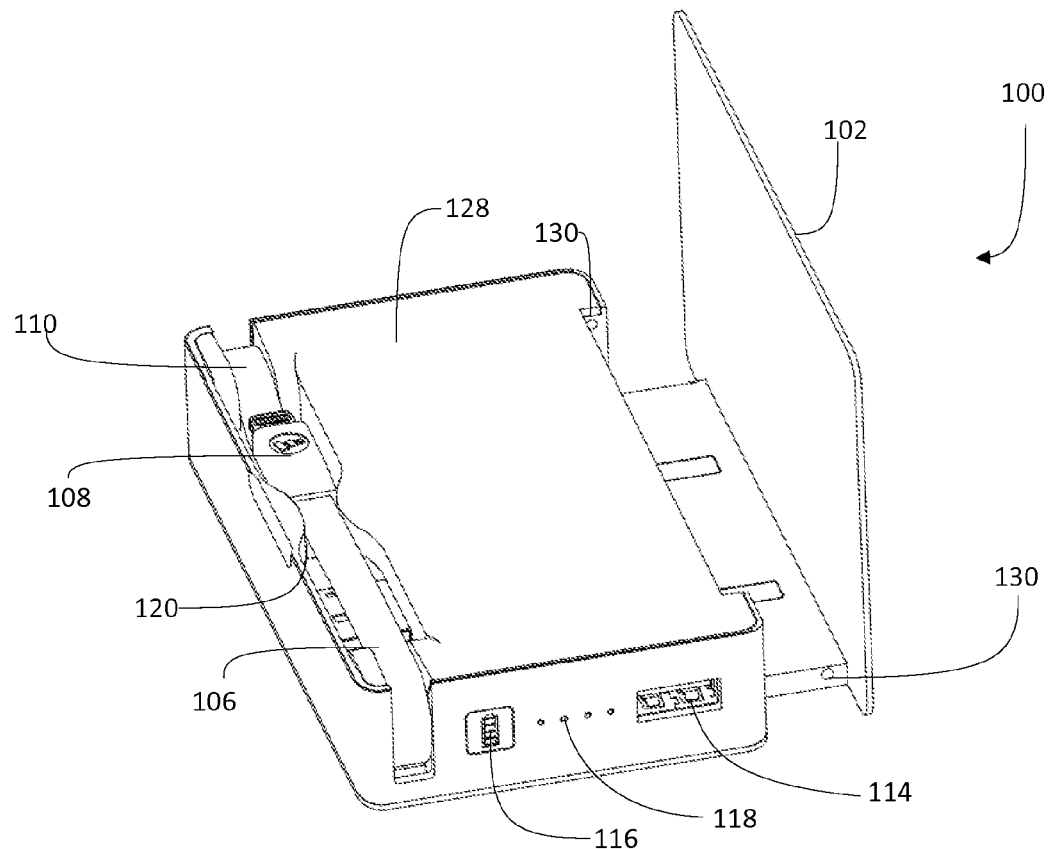
FIG. 3 shows an example of embodiments of a charging device with retracted cables and an open cover.
Figure 5:
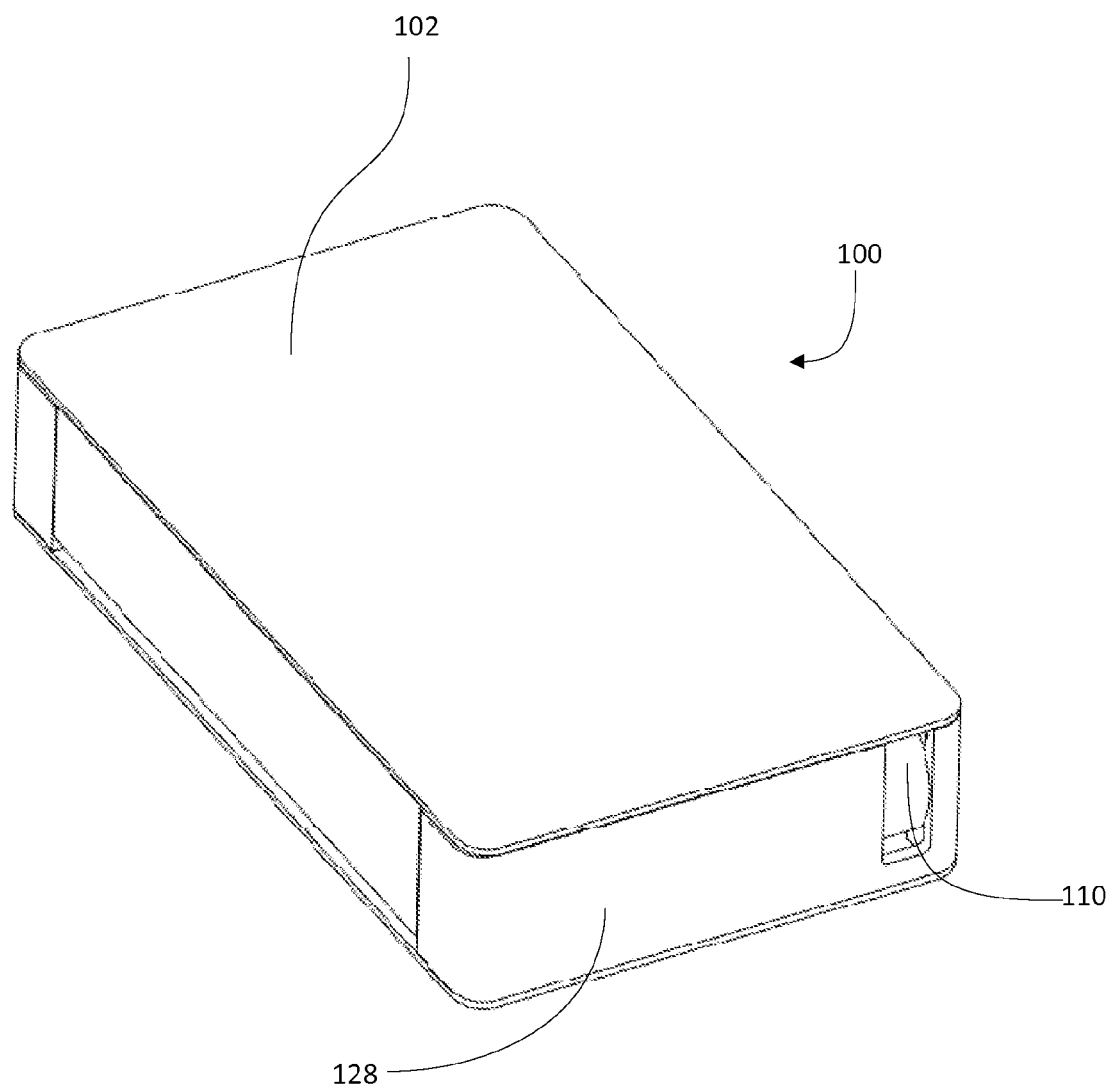
FIG. 5 shows an example of embodiments of a charging device with retracted cables and a closed cover.
Figure 6:
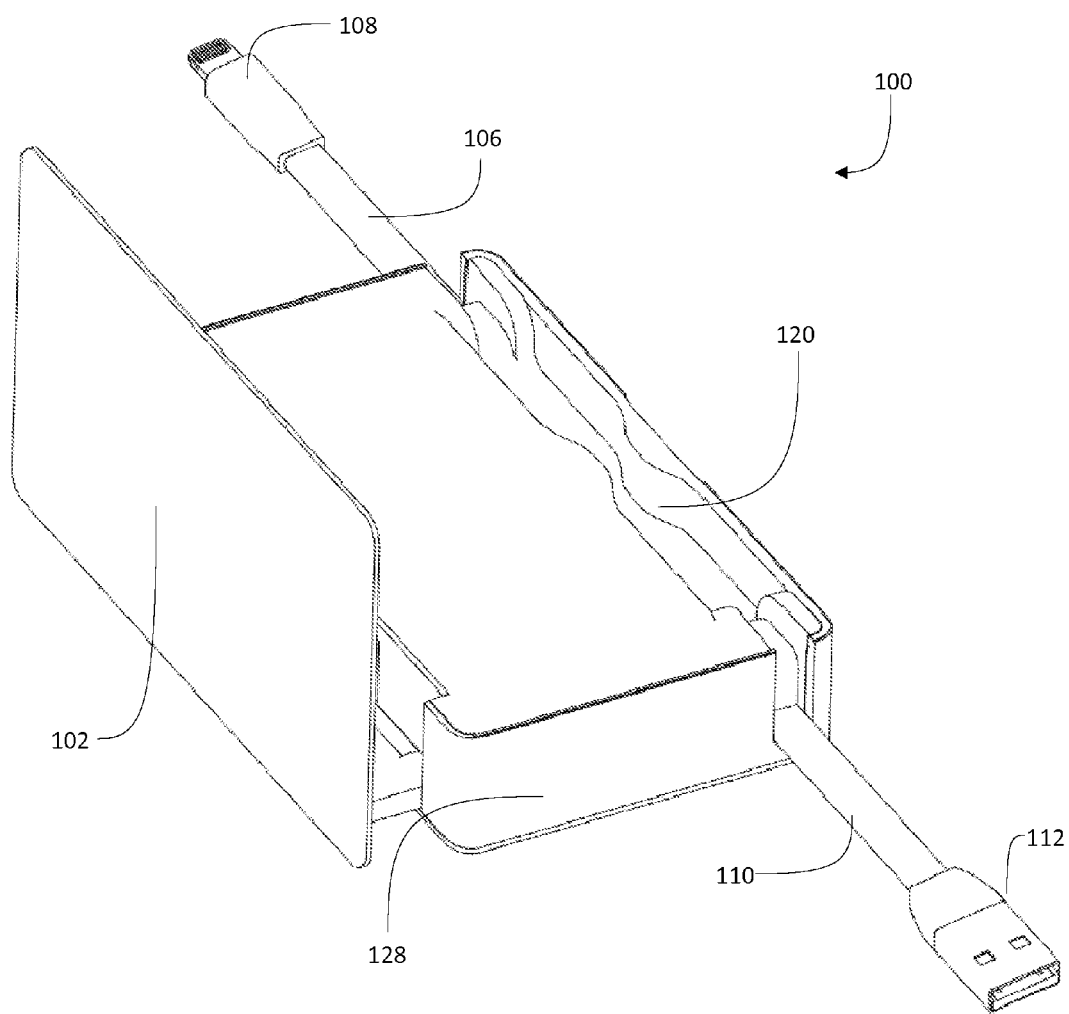
FIG. 6 shows an example of embodiments of a charging device with extended cables and an open cover.

FIGS. 1, 3, and 5 show examples of some embodiments of a charging device 100 with a retracted first electrical cable 106 and a retracted second electrical cable 110. Charging device 100 can include a cover 102. FIGS. 2 and 6 show examples of some embodiments of a charging device 100 with extended first and second electrical cables 106 and 110, and an open cover 102. As shown in FIG. 3, when in the retracted position, the first electrical cable 106 and the second electrical cable 110 can be positioned in the recessed portion 120. In the retracted positions, the first electrical cable 106 can be positioned on top of the second electrical cable 110 (e.g., as shown in FIG. 3) or the second electrical cable 110 can be positioned on top of the first electrical cable 106. In some embodiments, as shown in FIGS. 1 and 5, the retracted first and second electrical cables 106 and 110 can remain partially visible when the cover 102 is closed. The first and second electrical cables 106 and 110 can be configured so that once put in the extended position they will remain in the extended position without recoiling to the retracted position. In some embodiments, the one or more electrical cables (e.g., electrical cables 106 and 110) can be flexible such that a user can bend the electrical cables 106 and 110 in various directions when the electrical cables 106 and 110 are in the extended positions.

Figure 4:
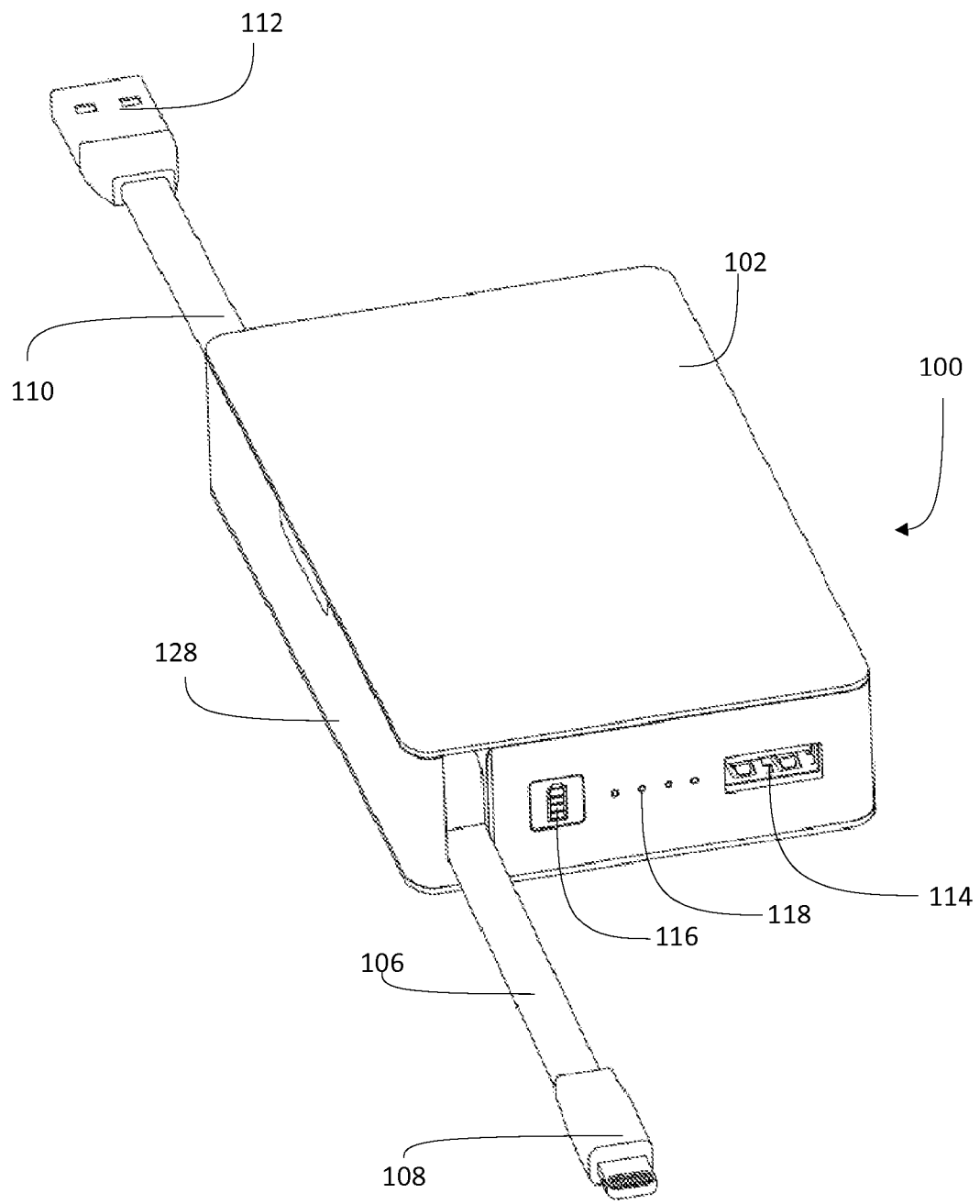
FIG. 4 shows an example of embodiments of a charging device with extended cables and a closed cover.

A cover 102 for a charging device 100 can be movable relative to the main body housing 128. In some embodiments, as can be seen by comparing FIGS. 1 and 2, the cover 102 can be movable between a closed position (as shown in FIG. 1) and an open position (as shown in FIG. 2). When in the closed positioned, a cover 102 can at least partially cover a recessed portion 120 to impede the first and second electrical cables 106 and 110 from moving between the retracted positions and the extended positions. In some embodiments a cover 102 can be in the closed position to impede the first and second cables 106 and 110 from moving from the retract position into the extended position, as shown in FIGS. 1 and 5. The cover 102 can be in the closed position to impede the first and second cables 106 and 110 from moving from the extended position into the retracted position, as shown in FIG. 4. A hinge can connect the cover 102 to the main body housing 128.

Charging device 100 can in some embodiments include engaging mechanisms 130 configured to restrict the movement of a cover 102 away from the main body housing 128. Engaging mechanisms 130 can in some embodiments include corresponding recessed portions and protrusions configured to snap together when engaged. In some embodiments engaging mechanisms 130 can include magnets configured to attract when in proximity in order to restrict the motion of the cover 102. In some embodiments engaging mechanisms 130 can include a moveable pin configured to engage or disengage with a corresponding recess in response to user input. In some embodiments engaging mechanisms 130 can include a latch or hook or other retaining element.

In some embodiments, a charging device 100 can include first and second electrical cables 106 and 110. A first electrical cable 106 can include a first electrical connector 108 configured to couple to a corresponding interface on an electronic device. The charging device 100 can be configured to charge the electronic device through the first electrical cable 106 using electrical power from a battery 124 disposed inside the main body 128. A second electrical cable 110 can include a second electrical connector 112 configured to couple to a power source. In some embodiments, the charging device can be configured to charge a battery 124 disposed inside the main body 128 using electrical power received from a power source 140 through the second electrical cable 110.

Many variations are possible. For example, in some embodiments, a charging device 100 can include three or more electrical cables (e.g., having two or more output electrical cables for charging multiple devices). In some embodiments, a charging device 100 can have a single electrical cable configured to receive electrical power to charge the battery 124 in a recharge mode (e.g., when coupled to a power supply) and configured to output electrical power from the battery 124 when in a discharge mode (e.g., when doupled to a mobile electronic device). The charging device 100 can include the electrical cable 106, which can be configured to output power from the battery 124, and in some embodiments the electrical cable 110 can be omitted. For example, the charging device 100 can include an electrical port configured to receive electrical power for recharging the battery 124. The charging device 100 can include the electrical cable 110, which can be configured to receive electrical power (e.g., from an external power supply) for charging the battery 124, and in some embodiments the electrical cable 106 can be omitted. For example, the charging device 100 can include an electrical port configured to output electrical power from the battery 124.

Figure 7:
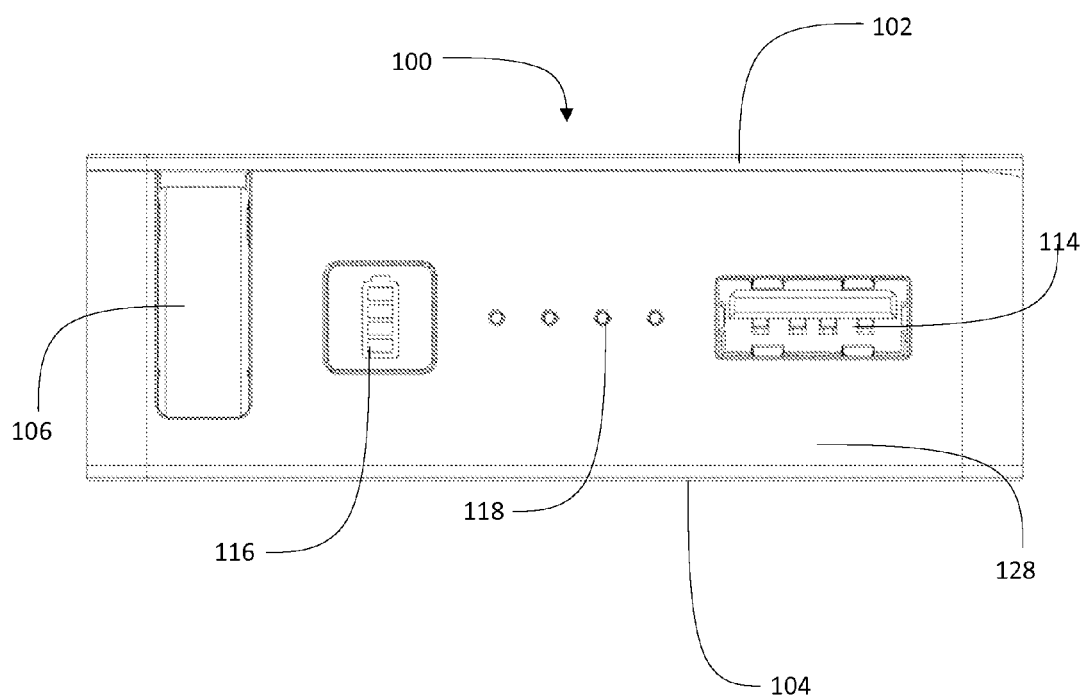
FIG. 7 shows a side detail view for an example of embodiments of a charging device with retracted cables and a closed cover.

As shown in FIG. 7, a charging device 100 can in some embodiments include a charge indicator 118. In some embodiments a charging device 100 can include a battery indicator user input element 116 (e.g., a button). A charge indicator 118 can display the amount of charge remaining on a battery 124 disposed within the main housing 128. The charge indictor 118 can, in some embodiments, include one or more lights (e.g., light emitting diodes (LEDs) configured such that the number of lights illuminated reflects the amount of charge remaining on a battery 124 (i.e. more lights illuminated indicates more charge remaining). A charge indicator 118 can in some embodiments be configured to indicate the amount of remaining charge at least in part by the color of light emitted. In some embodiments a charge indicator 118 can be configured to indicate the charge remaining on a battery 124 in response to user input received by the battery indicator user input element 116 (e.g., a user pressing the battery indicator button).

A charging device can include an electrical port 114. An electrical port 114 can be configured to receive an electrical connector and to output electrical power from a battery 124 disposed within main housing 128. In some embodiments an electrical port 114 can be configured to interface with one or more of a variety of industry standard electrical cables. In some embodiments the electrical port 114 can be configured to interface with one or more of the following: a USB cable, a mini-USB cable, a FireWire interface (e.g., IEEE 1394 interface), a Thunderbolt interface, a wall or car charger, etc. A charging device 100 can be configure to supply electrical power or signals simultaneously to multiple devices. In some embodiments, a charging device 100 can supply electrical power simultaneously through an electrical port 114 and a first electrical cable 106 (e.g., to simultaneously provide power to two electronic devices).

Figure 8:
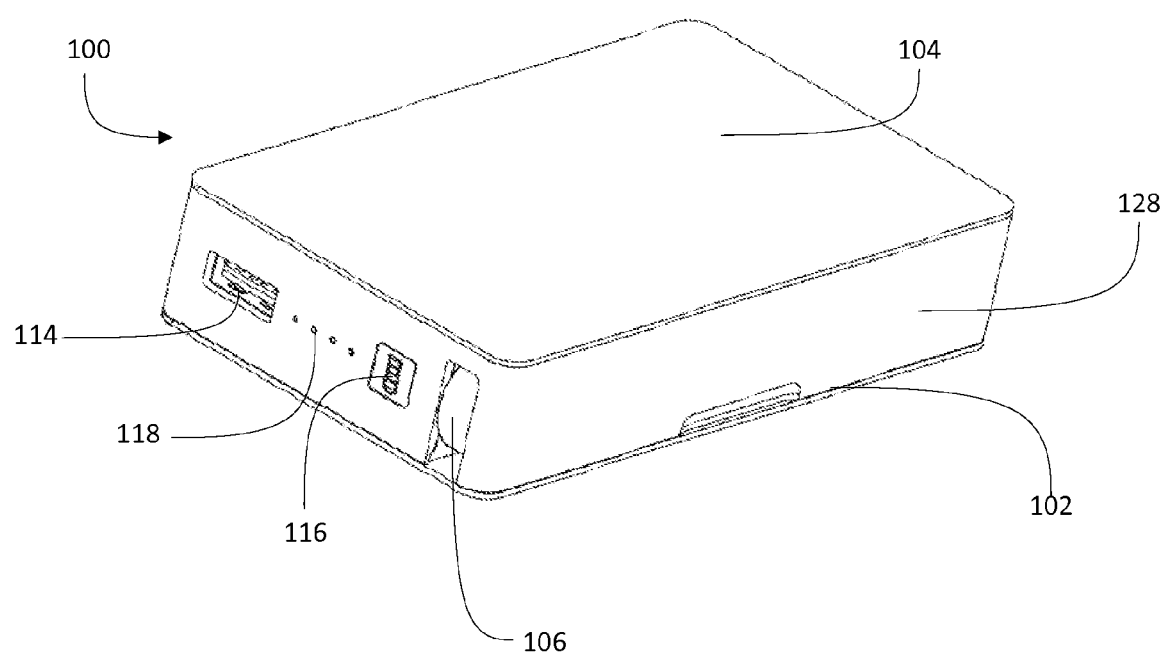
FIG. 8 shows an example of embodiments of a charging device with retracted cables and a thermally conductive outer wall.

In some embodiments, at least a portion of the outer housing of the charging device 100 can be thermally conductive and can be thermally coupled to one or more electrical components (e.g., the battery 124, a processor, etc.) that are inside the charging device 100 such that at least a portion of the outer housing of the charging device 100 can operate as a heat sink for the one or more electrical components. For example, the charging device 100 can include a thermally conductive back portion (e.g., on a side opposite the cover 102), which can be a thermally conductive back plate 104, as shown in FIGS. 8 through 10, although other portions of the outer housing (e.g., one or more side edges and/or a front portion) can be thermally conductive and can be used as a heat sink similar to the disclosure provided herein for the back plate 104.

A thermally conductive back plate 104 can be made of a metal or a metal alloy. In some embodiments a thermally conductive back plate 104 can be made of aluminum. In some embodiments, a thermally conductive back plate 104 can be made of a plastic or ceramic material suitable for the effective transfer of heat. For example, the thermally conductive back plate 104 can have a thermal conductivity of at least about 10 W/mK, at least about 30 W/mK, at least about 50 W/mK, at least about 100 W/mK, at least about 150 W/mK, at least about 200 W/mK, or more, although other values can be used in some cases. The thermally conductive back plate 104 can have a thermal conductivity of less than or equal to about 2000 W/mK, less than or equal to about 1000 W/mK, less than or equal to about 5000 W/mK, less than or equal to about 300 W/mK, although other values can be used in some cases as defined by power load and efficiency, or thermal requirements.

The thermally conductive back plate 104 can be configured to operate as a heat sink for a battery 124 disposed in a main body housing 128. In some embodiments a thermally conductive back plate can be configured to operate as a heat sink for electrical components 126 disposed in a main body housing 128. By way of example, the electrical components 126 can in some embodiments include any number of electrical or electronic components not limited to one or more of the following: a processor, a switch, an inductor, a memory, a capacitor, a voltage monitor, a conductive connector, or a semi-conductive connector, a battery, or combinations thereof. In some embodiments, the electrical components 126 can be on a printed circuit board or a flex circuit.

Figure 9:
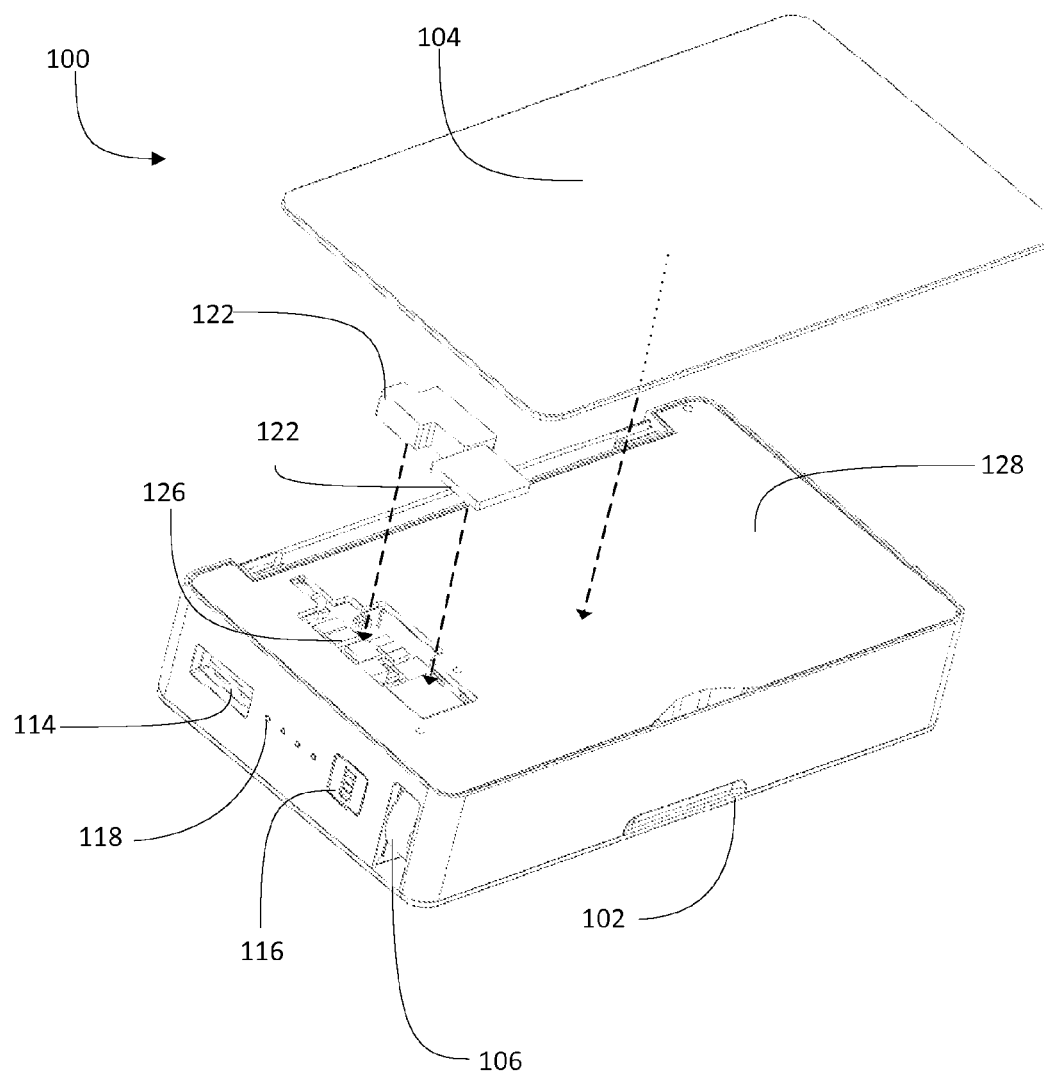
FIG. 9 shows an expanded view of an example of embodiments of a charging device having a thermally conductive outer wall and a plurality of thermal interfaces coupled to electrical components inside the main body.
Figure 10:
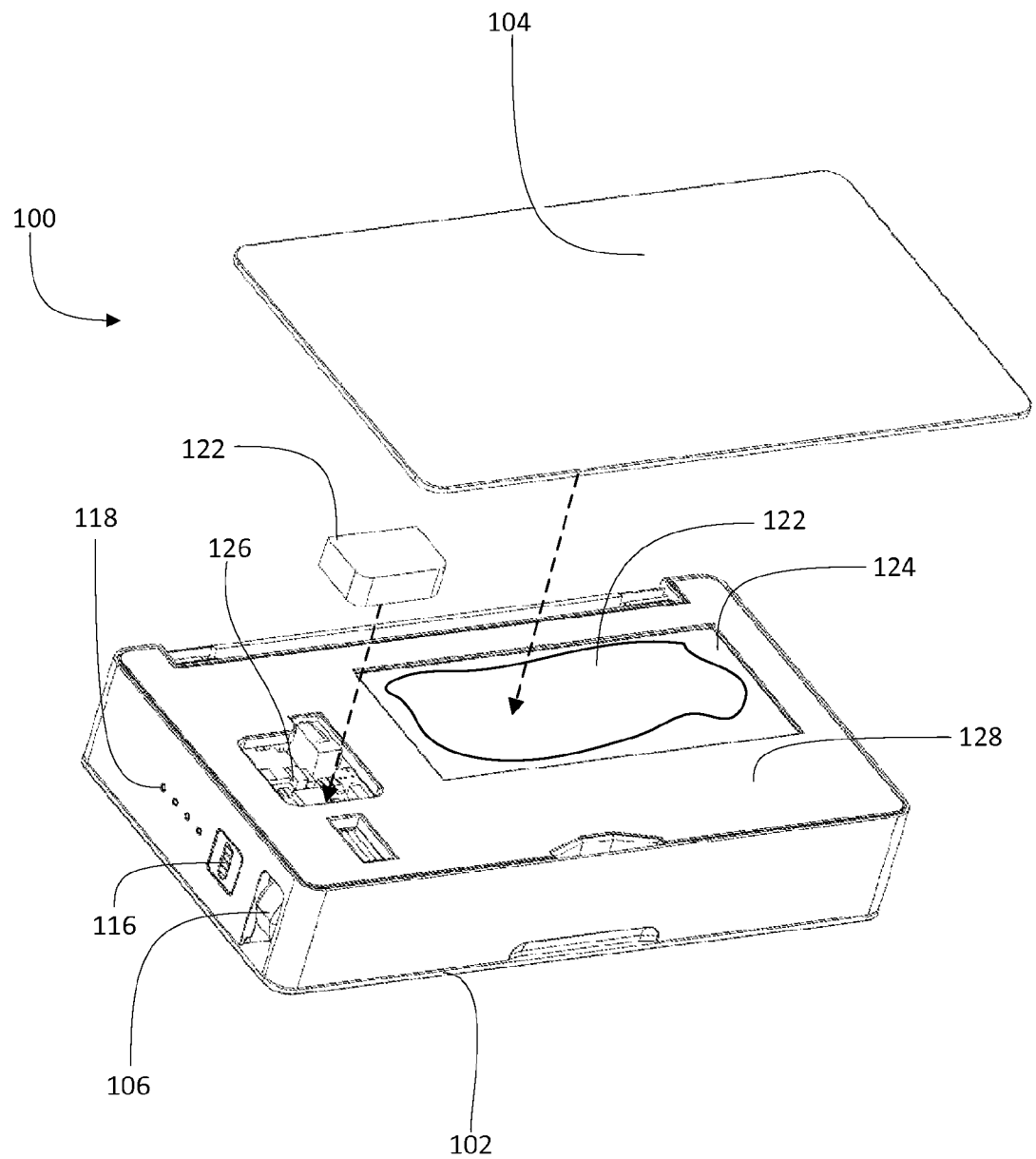
FIG. 10 shows an expanded view of an example of embodiments of a charging device having a thermally conductive outer wall thermally coupled to a battery.

As shown in FIG. 9, in some embodiments a thermally conductive back plate 104 can be thermally coupled to one or more electrical components 126. FIGS. 9 and 10 show expanded views of a charging device 100 with a thermally conductive back plate 104 displaced from its operable position in order to show the arrangement of electrical components 126 and thermal interfaces 122. A thermally conductive back plate 104 can be coupled to one or more electrical components through one or more thermal interfaces 122. By way of example, a thermal interface 122 can include one or more of the following: thermal grease, thermal gel, thermal compound, thermal paste, heat paste, heat sink paste, heat sink compound, or a thermal pad, or a direct connection to the conductive back plate 104 can be used. In some embodiments, more than one different thermal interface 122 can couple a thermally conductive back plate 104 to the electronic components 126. For example, a first thermal interface can couple the battery 124 to the thermally conductive back plate 104, and a second thermal interface can couple one or more other electrical components (e.g., a processor, etc.) to the thermally conductive back plate 104. In some embodiments, a single thermal interface can thermally couple multiple electrical components to the thermally conductive back plate 104. In some embodiments, one or more electrical components (e.g., the battery 124, a processor, and/or other electrical components, as discussed herein) can be directly thermally coupled to the thermally conductive back plate 104 (e.g., using a single thermal interface between any of the electrical components and the thermally conductive back plate 104). In some implementations, the charging device 100 does not include a heat spreader between the one or more electrical components and the thermally conductive back plate 104.

A thermally conductive back plate 104 can be thermally coupled to a battery 124. As shown in FIG. 10, a thermally conductive back plate 104 can be coupled directly to a battery 124. In some embodiments, a thermal interface 122 can thermally couple the thermally conductive back plate 104 with a battery 124. In some embodiments, the same thermal interface 122 can couple the thermally conductive back plate 104 to a battery 124 and to other electrical components 126. In some embodiments, a plurality of thermal interfaces 122 of one or more types can be used to couple the thermally conductive back plate 104 to electrical components 126 and a battery 124. In some implementations, thermal paste can thermally couple the battery 124 to the thermally conductive back plate 104, and a thermal pad can thermally couple the other electrical components 126 to the thermally conductive back plate 104.

As shown in FIG. 9, a thermally conductive back plate 104 can be thermally coupled to a battery disposed entirely within a main housing 128. A thermally conductive back plate 104 can be thermally coupled to other portions of the main housing 128. In some embodiments, one or more thermal interfaces 122 can thermally couple a thermally conductive back plate 104 with other portions of the main body housing 128.

Figure 11:
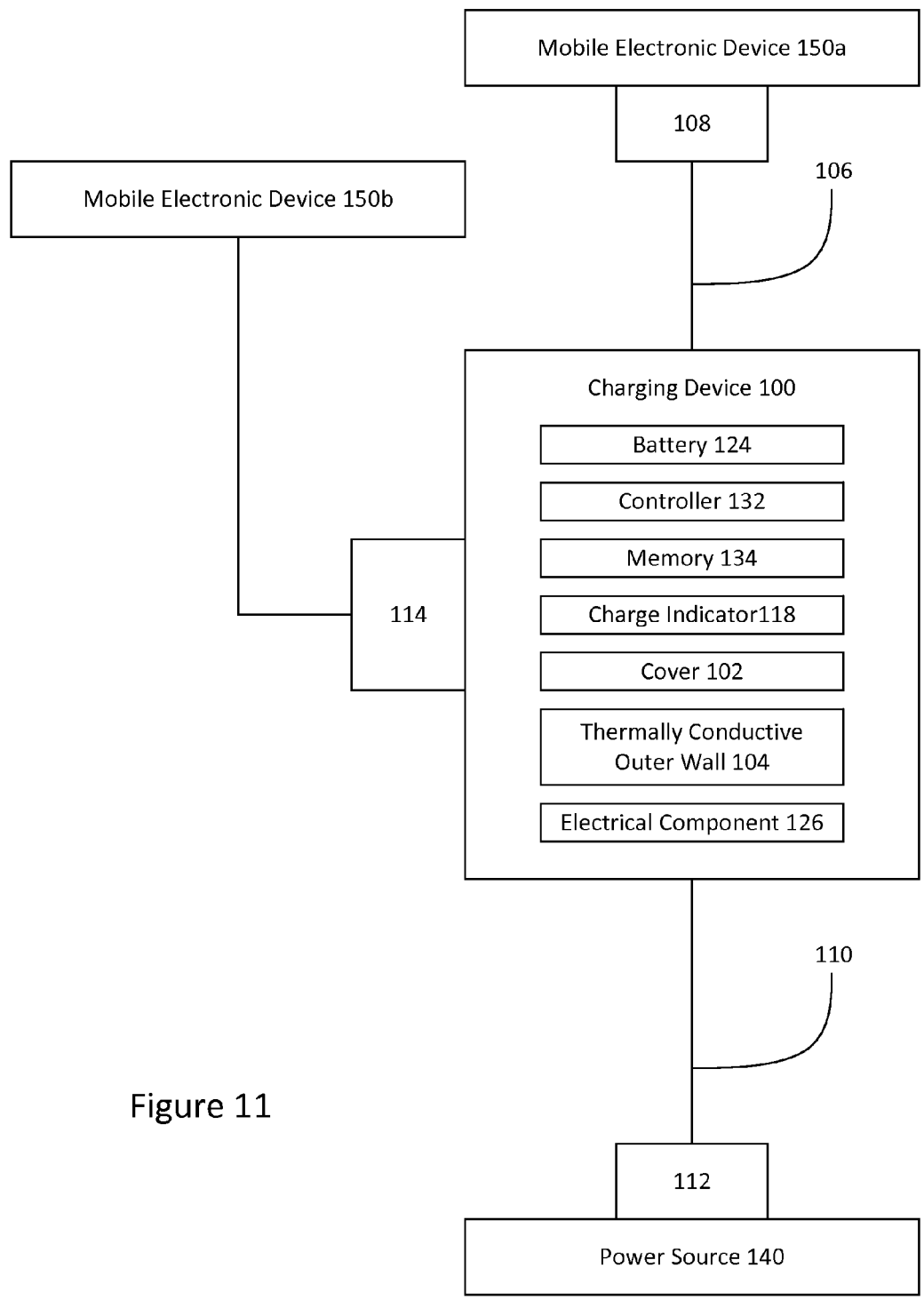
FIG. 11 shows a schematic example of embodiments of a charging device with a first electrical cable configured to couple to a mobile electronic device, and with a second electrical cable configured to couple to a power source.

FIG. 11 shows a schematic example of embodiments of a charging device 100 configured to interact with any combination of the following: a mobile electronic device 150a by a first electrical cable 106; a mobile electronic device 150b by electrical port 114; and a power source 140 by a second electrical cable 110. In some embodiments, the electrical port 114 can be omitted. In some embodiments, a charging device 100 can be configured to interact with a power source 140 coupled to the charging device 100 (e.g., to charge the battery 124 in a charging mode), in some cases when no mobile electronic device 150a or 150b is coupled to the charging device 100. The charging device 100 can be configured to interact with a mobile electronic device 150a or 150b that is coupled to the charging device 100 (e.g., to send power to the mobile electronic device 150a or 150b in a discharge mode), in some cases when no power source 140 is coupled to the charging device 100. In some embodiments a charging device 100 can be configured to interact with both a power source 140 and one or more mobile electronic devices 150a and/or 150b simultaneity. For example, the charging device 100 can pass electrical power received from the power source 140 to one or more mobile electronic devices 150a and/or 150b. In some embodiments, electrical power can be passed from the power source 140, through the charging device 100, to the one or more mobile electronic devices 150a and/or 150b without going through the battery 124 (e.g., in a bypass mode).

The mobile electronic device 150a or 150b can be a personal device configured to be portable and operate without a fixed connection to an external power source. The mobile electronic device 150a or 150b can be a cellular phone. An electronic device 150a or 150b can in some embodiments be an iPhone® or other smartphone. The electronic device 150a or 150b can in some embodiments be a laptop computer or a tablet computer. In some embodiments, the mobile electronic device 150a or 150b can be a portable media player or recording device. A power source 140 can be any source of electrical power external to the charging device 100. In some embodiments, a power source can be a wall electrical outlet. In some embodiments, a power source 140 can be an external battery. In some embodiments, a power source 140 can be an external electronic device such as a computer (e.g., having a USB port capable of outputting electrical power).

In some embodiments, a charging device 100 can include electrical components 126 such a controller 132 and a memory 134 and additional electrical components, as discussed herein. The controller 132 can include one or more computer processors (e.g., a general purpose processor or a special purpose processor), which can be configured to execute computer-executable instructions stored on memory 134 to implement various features described herein. A controller 132 can determine when a charging device 100 has been connected to a mobile electronic device 150a or 150b, or to a power source 140. In some embodiments, a controller 132 can initiate an action in response to detecting the connection of a power source 140 or a mobile electronic device 150a or 150b to the charging device 100, without further user input. Actions by the controller 132 can in some embodiments include initiating the charging of a battery 124 in response to detecting the connection to a power source 140. Actions by controller 132 can in some embodiments include initiating the charging of a mobile electronic device 150a or 150b from a battery 124 in response to detecting the connection to a mobile electronic device 150a or 150b, and in some cases the controller 132 can detect the presence of charge on battery 124, e.g., before outputting electrical power to charge a mobile electronic device 150a or 150b. A controller 132 can in some embodiments interact with one or more switches to direct electricity through in the charging device 100. A controller 132 in some embodiments can interact with one or more voltage modifiers.

In some embodiments, a charging device 100 can be configured to pass charge directly from a power source 140 to an electronic device 150a or 150b. The charging device 100 can include a bypass electrical pathway from the second electrical cable 110 to the first electrical cable 106, which can be used to relay electrical charge from the power source 140, through the charging device 100, to the electronic device 150a or 150b. The bypass electrical pathway can in some embodiments include or extend through a voltage modifier, which can adjust the voltage output by the charging device 100 to be a voltage acceptable to the mobile electronic device 150a or 150b. In some embodiments, the bypass electrical pathway does not go through, or otherwise include, the battery 124. A voltage modifier can adjust the voltage to an appropriate voltage level for the electronic device 150a or 150b. In some embodiments, a discharge electrical pathway can be configured to deliver electrical power from the battery 124 to a mobile electronic device 150a or 150b via the electrical cable 106 or electrical port 114. The discharge electrical pathway and the bypass electrical pathway can both use the same voltage modifier (e.g., the same boost converter or voltage regulator), although a bypass electrical pathway may use a different voltage modifier than the discharge electrical pathway in some implementations.

A switch can be closed to direct electrical charge along the bypass electrical pathway (e.g., to charge the electronic device 150a or 150b using the power source 140 and bypassing the battery 124). The switch can be opened to disrupt the bypass electrical pathway (e.g., so that electrical power input through the second electrical cable 110 is not passed through to charge the electronic device 150a or 150b). In some embodiments a portion of the electrical charge from a power source 140 can be used to charge the electronic device 150a or 150b, while a portion of the electrical charge is used to charge the battery 124 (e.g., via a charging electrical pathway from the electrical cable 110 to the battery 124). The charging device can be configured to direct electrical charge from power source 140 to both a battery 124 and to an electronic device 150a or 150b. Additional details are disclosed in U.S. Provisional Patent Application No. 62/045,461 (the '461 Application), titled "Systems and Methods for Battery Charging and Management," and filed on Sep. 3, 2014, the entirety of which is hereby incorporated by reference.

In various embodiments, the charging device 100 can enable communication of data between an external electronic device (e.g., a personal computer, a laptop, a tablet computer, etc.) and one or more electronic devices 150a and/or 150b. The external electronic device can be a power source 140, in some embodiments. One or more data communication lines can extend between the second electrical cable connector 112 and the first electrical cable connector 108, and/or between the second electrical cable connector 112 and the electrical port 114. Data can be passed through the charging device 100 (e.g., for syncing the electronic device 150a or 150b with an external electronic device such as a computer). The charging device 100 can receive information from the electronic device 150a or 150b (e.g., via the first electrical cable 106 or the electrical port 114). The charging device 100 can transfer the data to the second electrical cable connector 112, where the data can be transmitted to an external electronic device. Similarly, the second electrical cable connector 112 can receive data from an external electronic device (e.g., a personal computer, laptop, or tablet computer), and the charging device 100 can transmit the data to the first electrical cable connector 108 such that the data is communicated to the mobile electronic device 150a or 150b. Accordingly, the charging device 100 can enable the mobile electronic device 150a or 150b to send data to and/or receive data from an external electronic device that is coupled to the charging device 100, and in many implementations without a direct data connection between the electronic device 150a or 150b and the external electronic device. Accordingly, a user can utilize the charging device 100 for syncing the electronic device 150a or 150b, so that the user does not need to carry a separate cable for syncing. In some embodiments, the charging device 100 can transmit electrical power from a power source 140 of an external electronic device to an electronic device 150*a* or 150*b* while simultaneously transmitting data between the external electronic device and the mobile electronic device 150*a* or 150*b*. Additional details disclosed in the '461 Application can be applied to the charging device 100.

Many of the features, systems, and methods disclosed herein can be implemented in hardware, software, firmware, or a combination thereof. Software can include computer-readable instructions stored in memory (e.g., non-transitory, tangible memory, such as solid state memory (e.g., ROM, EEPROM, FLASH, RAM), optical memory (e.g., a CD, DVD, Blu-ray disc, etc.), magnetic memory (e.g., a hard disc drive), etc.), configured to implement the algorithms on a general purpose computer, special purpose processors, or combinations thereof. For example, one or more computing devices, such as a processor, may execute program instructions stored in computer readable memory to carry out features and processes disclosed herein. Hardware may include state machines, one or more general purpose computers, and/or one or more special purpose processors. While certain types of user interfaces and controls are described herein for illustrative purposes, other types of user interfaces and controls may be used.

The embodiments discussed herein are provided by way of example, and various modifications can be made to the embodiments described herein. Certain features that are described in this disclosure in the context of separate embodiments can also be implemented in combination in a single embodiment. Conversely, various features that are described in the context of a single embodiment can be implemented in multiple embodiments separately or in various suitable subcombinations. Also, features described in connection with one combination can be excised from that combination and can be combined with other features in various combinations and subcombinations.

Similarly, while operations are depicted in the drawings or described in a particular order, the operations can be performed in a different order than shown or described. Other operations not depicted can be incorporated before, after, or simultaneously with the operations shown or described. In certain circumstances, parallel processing or multitasking can be used. Also, in some cases, the operations shown or discussed can be omitted or recombined to form various combinations and subcombinations.

What is claimed is:

1. A charging device for charging an electronic device, the charging device comprising:
    a main body comprising at least one recess;
    a battery disposed inside the main body;
    a first electrical cable movable between a retracted position and an extended position, wherein the first electrical cable is disposed in the at least one recess when in the retracted position, wherein the first electrical cable extends outside the main body when in the extended position, wherein the first electrical cable comprises a first electrical connector configured to couple to a corresponding interface on an electronic device, and wherein the charging device is configured to charge the electronic device through the first electrical cable using electrical power from the battery;
    a second electrical cable movable between a retracted position and an extended position, wherein the second electrical cable is disposed in the at least one recess when in the retracted position, wherein the second electrical cable extends outside the main body when in the extended position, wherein the second electrical cable comprises a second electrical connector configured to couple to a power source, and wherein the charging device is configured to charge the battery using electrical power received through the second electrical cable; and
    a cover that is movable relative to the main body, wherein the cover is movable between a closed position and an open position, wherein the cover in the closed positioned covers at least a portion of the recess to impede the first and second electrical cables from moving between the retracted positions and the extended positions, and wherein the cover in the open position is configured to expose the recess such that the first and second electrical cables are movable between the retracted positions and the extended positions;
    wherein the first electrical cable can selectively be positioned on to of the second electrical cable when in the retracted positions, and wherein the second electrical cable can selectively be positioned on to of the first electrical cable when in the retracted positions.

2. The charging device of claim 1, wherein the main body comprises a thermally conductive outer wall, wherein one or more electrical components inside the main body are thermally coupled to the thermally conductive outer wall to dissipate heat from the one or more electrical components through the thermally conductive outer wall.

3. The charging device of claim 2, wherein a first side of a thermal interface material contacts the battery and a second side of the thermal interface material contacts the thermally conductive outer wall.

4. The charging device of claim 3, wherein the thermal interface material comprises thermal grease, thermal paste, or a thermal pad.

5. The charging device of claim 2, wherein a first thermal interface material directly thermally couples the battery to the thermally conductive outer wall.

6. The charging device of claim 5, wherein a second thermal interface material directly thermally couples one or more electrical components on a printed circuit board to the thermally conductive outer wall.

7. The charging device of claim 2, wherein the one or more electrical components are coupled to the thermally conductive outer wall by a thermal interface material without a heat spreader disposed between the one or more electrical components and the thermally conductive outer wall.

8. The charging device of claim 1, wherein both the first electrical cable and the second electrical cable are disposed in the same recess in the main body when in the retracted positions.

9. The charging device of claim 1, wherein one of the first and second electrical cables is disposed to rest on top of the other of the first and second electrical cables when in the retracted positions.

10. The charging device of claim 1, wherein the cover pivots between the closed position and the open position.

11. The charging device of claim 1, wherein a portion of the first electrical cable is exposed when the cover is in the closed position, and wherein a portion of the second electrical cable is exposed when the cover is in the closed position.

12. The charging device of claim 1, wherein the charging device is configured to pass electrical power received through the second electrical cable to the first electrical cable to charge the electronic device without using the battery.

13. The charging device of claim 1, the charging device is configured to transfer data between the electronic device coupled to the first electrical cable and an external electronic device coupled to the second electrical cable.

14. A charging device comprising:
    a main body housing with at least one recessed portion;

a battery disposed within the main body housing;

a cover hingedly coupled to the main body housing and configured to move between an open position and a closed position; and a plurality of electrical cables each configured to move between an extended position and a retracted position, wherein the plurality of electrical cables are configured to fit within the at least one recessed portion of the main body housing when in the retracted positions, and wherein a first electrical cable comprises a first electrical connector and a second electrical cable comprises a second electrical connector;

wherein the plurality of electrical cables are disposed in the same recess, wherein the first electrical cable can selectively be positioned on top of the second electrical cable when in the retracted positions, and wherein the second electrical cable can selectively be positioned on top of the first electrical cable when in the retracted positions.

15. The charging device of claim 14, wherein the cover is further configured so that in the closed position the cover overlaps with at least a portion of the at least one recessed portion of the main body housing.

16. The charging device of claim 14, further comprising an electrical port on the main body, wherein the electrical port is configured to receive an electrical connector and to output electrical power from the battery to the electrical connector.

17. The charging device of claim 14, further comprising:
one or more electrical components; and
a thermally conductive outer wall configured to dissipate heat from the one or more electrical components.

18. The charging device of claim 14, further comprising:
a thermally conductive outer wall configured to couple to the battery and to dissipate heat from the battery.

19. The charging device of claim 14, wherein the plurality of electrical cables pivot between the extended position and the retracted position.

20. The charging device of claim 2, wherein the cover is disposed on a first side of the main body, and wherein the thermally conductive outer wall is on a second side of the main body opposite the cover.

* * * * *